(12) United States Patent
Kang

(10) Patent No.: US 7,701,775 B2
(45) Date of Patent: Apr. 20, 2010

(54) FLASH MEMORY DEVICE UTILIZING MULTI-PAGE PROGRAM METHOD

(75) Inventor: Dong-Ku Kang, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 58 days.

(21) Appl. No.: 12/034,876

(22) Filed: Feb. 21, 2008

(65) Prior Publication Data

US 2008/0205161 A1   Aug. 28, 2008

(30) Foreign Application Priority Data

Feb. 27, 2007   (KR) .................. 10-2007-0019764

(51) Int. Cl.
  *G11C 16/06*   (2006.01)
(52) U.S. Cl. .................. 365/185.21; 365/185.03; 365/185.22; 365/185.28
(58) Field of Classification Search ............ 365/185.03, 365/185.21, 185.22, 185.28
See application file for complete search history.

(56) References Cited

U.S. PATENT DOCUMENTS

2007/0041247 A1* 2/2007 Kang et al. ............ 365/185.12
2008/0056007 A1* 3/2008 Kang et al. ............ 365/185.22

FOREIGN PATENT DOCUMENTS

| JP | 11306770 | 11/1999 |
|----|----------|---------|
| JP | 2004206833 | 7/2004 |
| KR | 1020010044902 | 6/2001 |
| KR | 1020040057972 A | 7/2004 |
| KR | 1020050007653 A | 1/2005 |
| KR | 1020050087264 | 8/2005 |
| KR | 1020060006332 A | 1/2006 |
| KR | 1020070010305 | 1/2007 |
| KR | 1020070024110 | 3/2007 |

* cited by examiner

Primary Examiner—Hoai V Ho
(74) Attorney, Agent, or Firm—Volentine & Whitt, PLLC

(57) ABSTRACT

A flash memory device is configured to store multi-bit data on one cell utilizing fewer program operations. The flash memory device includes a memory cell, a sense amplifier and a write driver circuit. The sense amplifier is connected to a word line and a bit line. The sense amplifier and write driver circuit store data bits to be programmed on the memory cell. The sense amplifier and write driver circuit drives the bit line through a program voltage during a program execution period when at least one bit from among the data bits to be programmed is a program data bit, and performs a verify read operation when a program verify code representing a verify read period corresponds to a state of the data bits to be programmed.

17 Claims, 10 Drawing Sheets

| LCH0 | |
|---|---|
| 1<br>(When all data bits in a program data latch circuit) | 0<br>(When at least one of data bits is a program data bit) |
| Program Disable<br><br>(Program inhibit) | Program Ensable<br><br>(Program execute) |

FLASH MEMORY DEVICE UTILIZING MULTI-PAGE PROGRAM METHOD

CROSS-REFERENCE TO RELATED APPLICATIONS

This application claims the benefit of Korean Patent Application No. 10-2007-0019764, filed on Feb. 27, 2007 in the Korean Intellectual Property Office, the disclosure of which is incorporated herein in its entirety.

BACKGROUND OF THE INVENTION

1. Field of the Invention

Embodiments of the invention relate to semiconductor memory devices. More particularly, embodiments of the invention relate to a flash memory device configured to store multi-bit data on one cell.

2. Discussion of Related Art

Storage devices such as volatile and non-volatile memories have been increasingly utilized in mobile electronic devices such as MP3 players, PMPs, mobile phones, laptops, PDAs, etc. However, these mobile devices require high capacity memory storage to provide various operational functions (e.g., multimedia). One type of memory storage device is a multi-bit memory device which is used to store more than 2-bit data on one memory cell. These exemplary multi-bit memory devices are disclosed in U.S. Pat. No. 6,122,188, entitled "NON-VOLATILE MEMORY DEVICE HAVING MULTI-BIT CELL STRUCTURE AND A METHOD OF PROGRAMMING SAME", and in U.S. Pat. No. 5,923,587, entitled "MULTI-BIT MEMORY CELL ARRAY OF A NON-VOLATILE SEMICONDUCTOR MEMORY DEVICE AND METHOD FOR DRIVING THE SAME" which are hereby incorporated by reference.

When storing 1-bit data on a memory cell, the memory cell has a threshold voltage included in one of two threshold voltage distributions. That is, the memory cell has one of two states representing data 1 or data 0. However, when storing 2-bit data on one memory cell, the memory cell has a threshold voltage included in one of four threshold voltage distributions where the four states represent data 11, data 10, data 00, and data 01. Two data bits stored in each memory cell respectively constitutes page data (hereinafter, referred to as least significant bit (LSB) data and a most significant bit (MSB) data). An LSB data bit is programmed into a memory cell and then an MSB data bit is programmed into the same memory cell. This is called a page program method.

A memory cell may be programmed to have one of the states 11, 10, 00, and 01. For convenience, states 11, 10, 00, and 01 correspond to ST0, ST1, ST2, and ST3, respectively. A threshold voltage of a memory cell with state 11 is an erased memory cell. A threshold voltage of a memory cell with state 10 is higher than that of a memory cell with state 11. A threshold voltage of a memory cell with state 00 is higher than that of a memory cell with state 10. A threshold voltage of a memory cell with state 01 is higher than that of a memory cell with state 00. As illustrated in FIG. 1*a*, once an LSB program operation is performed a memory cell has an erased state corresponding to state 10 (ST1). Once an MSB program operation is performed after the LSB program operation, as illustrated in FIG. 1*b*, the memory cell having state 11 has an erased state 01, but the memory cell with state 10 has states 10 or 00. That is, the memory cell is programmed with state 01 when LSB data is 1 and programmed with state 00 when the LSB data is 0. The MSB program operation is performed using an LSB data value programmed during the LSB program operation. The LSB data are read from the memory cell before performing the MSB program operation which is performed according to the read LSB data. This read operation is called an initial read operation.

The above page program method requires an initial read operation and causes disturbances due to an increase in the number of program operations. The number of program operations includes the LSB program operation and the MSB program operation where each program operation includes a plurality of program loops.

SUMMARY OF THE INVENTION

Exemplary embodiments of the present invention are directed to a flash memory device. In an exemplary embodiment, the flash memory device includes a memory cell and a sense amplifier write driver circuit. The memory cell is connected to a word line and a bit line of a memory array. The sense amplifier and write driver circuit communicates with the memory cell array and is configured to store data bits to be programmed on the memory cell. The sense amplifier and write driver circuit is further configured to drive the bit line of the memory array through a program voltage during a program execution period when at least one data bit from among the data bits to be programmed is a program data bit. The sense amplifier and write driver circuit is also configured to perform a verify read operation when a program verify code representing a verify read period corresponds to a state of the data bits to be programmed.

DESCRIPTION OF EMBODIMENTS

Figure 1A:
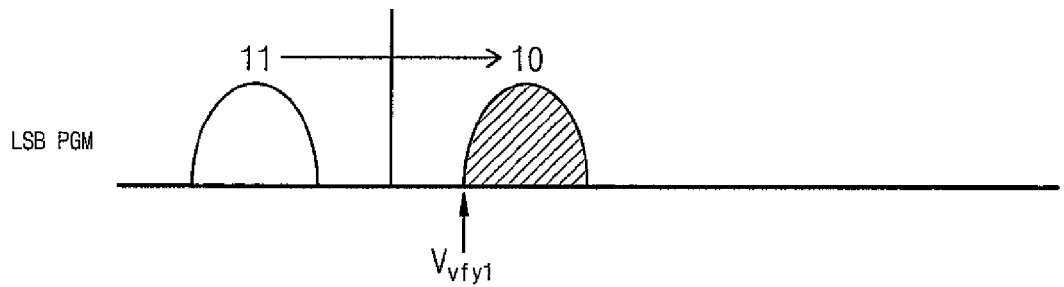
FIGS. 1A and 1B are view of a program method according to a typical page program method.
Figure 1B:
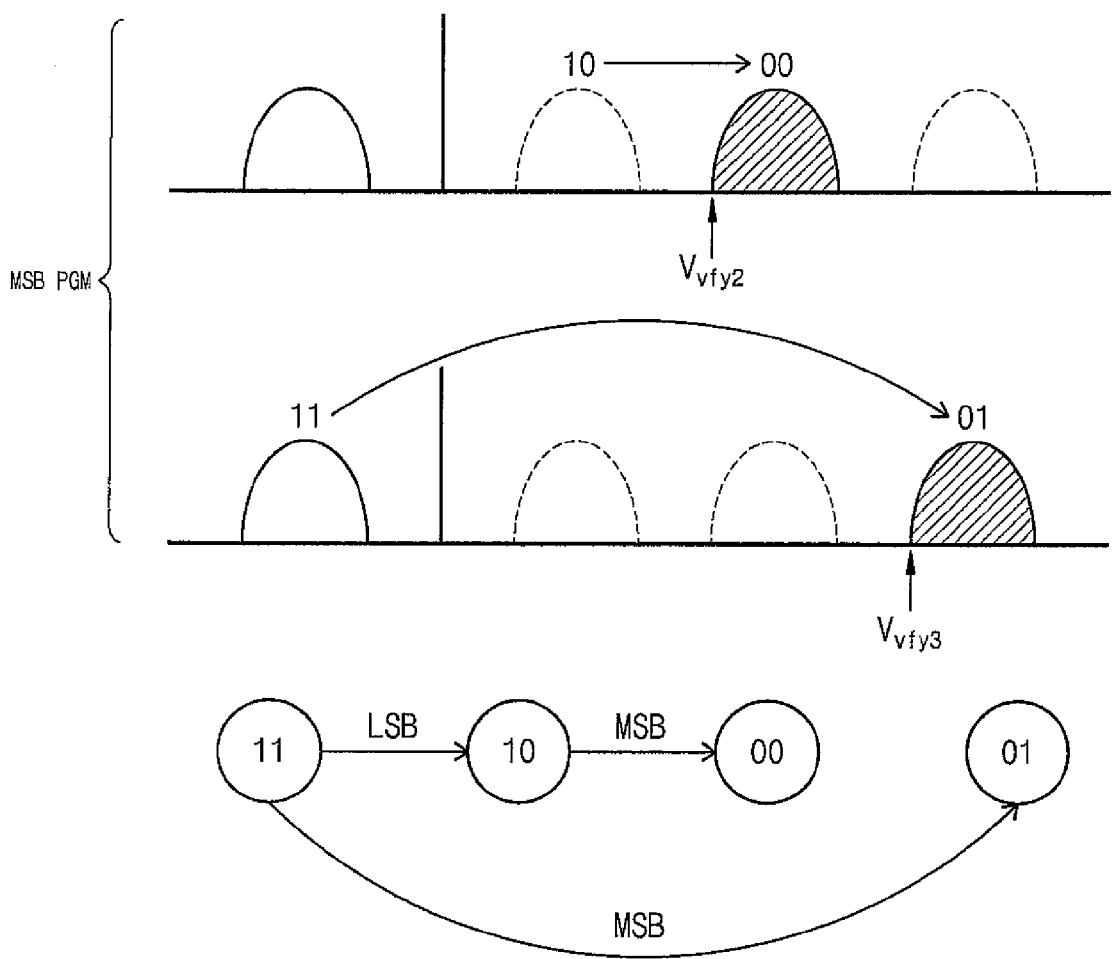

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 2:
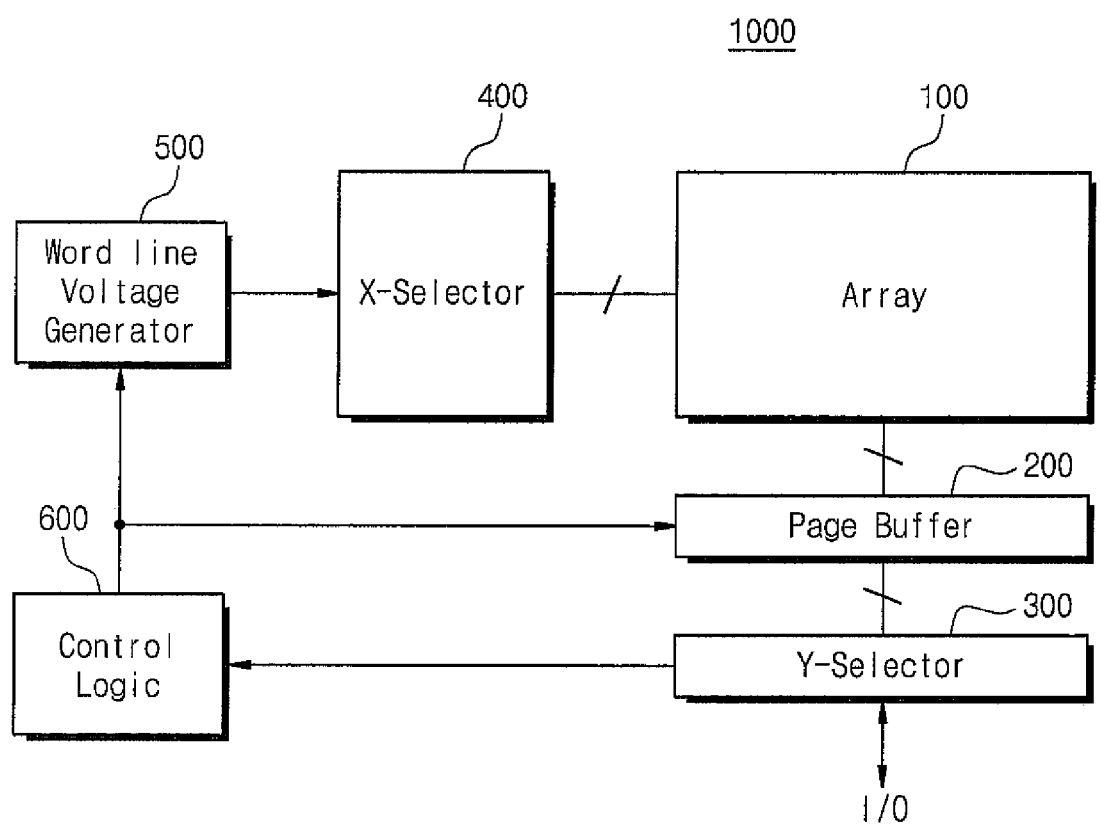
FIG. 2 is a block diagram of a flash memory device according to an embodiment of the present invention.

FIG. 2 is a block diagram of a flash memory device 1000 including memory cell array 110 having a plurality of memory cells (not shown) arranged in rows and columns. Each of the memory cells may store M-bit data (M is an integer equal to or higher than 2). Page buffer block 200 reads and programs multi-bit data from and into memory cell array 100 and includes a sense amplifier and write driver circuit to appropriately perform read and write operations. A column select circuit 300 provides a data transmission path between page buffer block 200 and an input/output interface (not shown). Row select circuit 400 selects rows of memory cell array 100 and drives the selected rows through a word line voltage. Word line voltage generation circuit 500 generates word line voltages (e.g., a program voltage, a read voltage, a pass voltage, a verify read voltage, etc.) for each operation mode. As is well known, a program voltage utilized as a word line voltage is increased by a predetermined increment during program loop repetitions. Control logic 600 controls general operations of flash memory device 1000.

Figure 3:
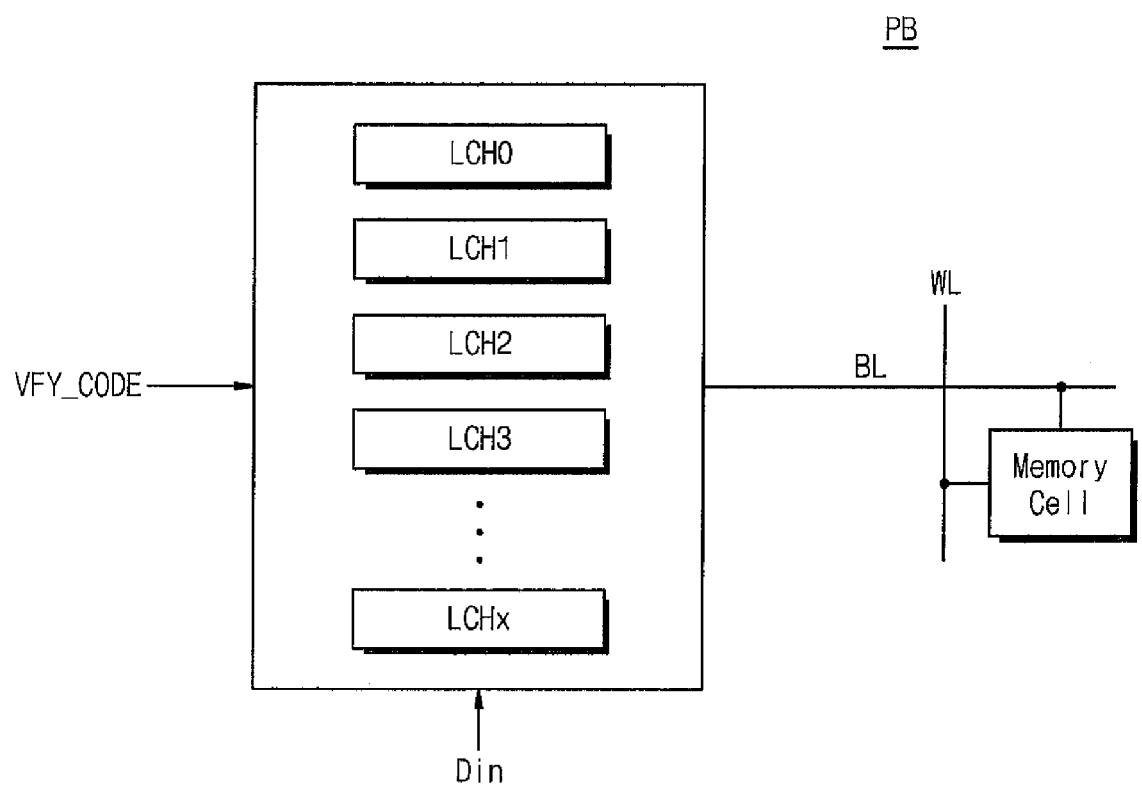
FIG. 3 is a block diagram illustrating a portion of a page buffer block of FIG. 2 according to an embodiment of the present invention.
Figures 4, 5:
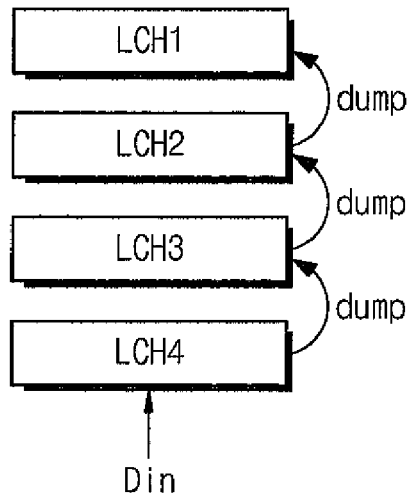
FIG. 4 is a view illustrating an operation for loading data bits to a page buffer of FIG. 3.
FIG. 5 is a view illustrating an operation for setting a program verify latch of a page buffer of FIG. 3.

FIG. 3 is a block diagram of a page buffer PB illustrating one column of page buffer block 200 of FIG. 2. Page buffer PB includes a plurality of latches LCH0 to LCHx similar to a sense amplifier and write driver circuit. By way of example, when storing 4-bit data on one memory cell, page buffer PB includes five latches. Latches LCH1 to LCHx are used to store multi-bit data to be programmed and latch LCH0 is used to combine values stored in latches LCH1 to LCHx. Hereinafter, latch LCH0 is called a program confirm latch and latches LCH1 to LCHx are called a program data latch circuit. The program data latch circuit loads data bits to be programmed according to a dump scheme (or, a shift scheme). FIG. 4 illustrates an operation for loading data bits to the page buffer of FIG. 3. For example, when the program latch circuit includes four latches LCH1 to LCH 4, a first data bit (or, a first page data bit) is loaded into latch LCH4 first. After the first data bit loaded to latch LCH4 is dumped to latch LCH3, a second data bit (or, a second page data bit) is loaded to latch LCH4. The first data bit dumped to latch LCH3 is dumped to latch LCH2 and the second data bit loaded to latch LCH4 is dumped to latch LCH3. A third data bit (or, a third page data bit) is loaded into latch (LCH4). Lastly, the first data bit dumped to latch LCH2 is dumped to latch LCH2 and the third data bit loaded to latch LCH4 is dumped to latch LCH3. A fourth data bit (or, a fourth page data bit) is loaded to latch LCH4. Through this dump scheme, data bits (or, page data bits) to be programmed are loaded into page buffer PB. Before data to be programmed is inputted, the program confirm circuit is set with a program prohibit data bit. It's apparent to those skilled in the art that the program confirm latch circuit is set with a program data bit before the data to be programmed is inputted.

Program confirm latch LCH0 is set with data bit 0 when at least one bit among the data bits in the program data latch circuit is a program data bit (e.g., 0). Alternatively, program confirm latch LCH0 is set with a data bit 1 when all the data bits stored in the program data latch circuit are program prohibit data bits (e.g., 1). FIG. 5 illustrates an operation for setting a program verify latch of the page buffer shown in FIG. 3. Bit line BL is driven by a program prohibit voltage (e.g., a supply voltage) during a program execution period. Page buffer PB selectively performs a verify read operation according to whether or not a program verify code VFY_CODE from control logic 600 represents a program verify period of states corresponding to data values stored in the program data latch circuits. Program verify code VFY_CODE represents each program verify period associated with each program loop. For example, when the program verify code VFY_CODE represents a program verify period of states corresponding to data values stored in the program data latch circuits, a data bit is read from the memory cell programmed through page buffer PB. When the program verify code VFY_CODE represents a program verify period of states corresponding to data values stored in the program data latch circuit, a data bit is not read from the memory cell programmed through page buffer PB. In this manner, page buffer PB determines whether or not a program verify operation of each program loop is performed via the data stored in the program data latch circuits and the program verify code VFY_CODE such that multi-bit data can be programmed without an initial read operation.

Figure 6:
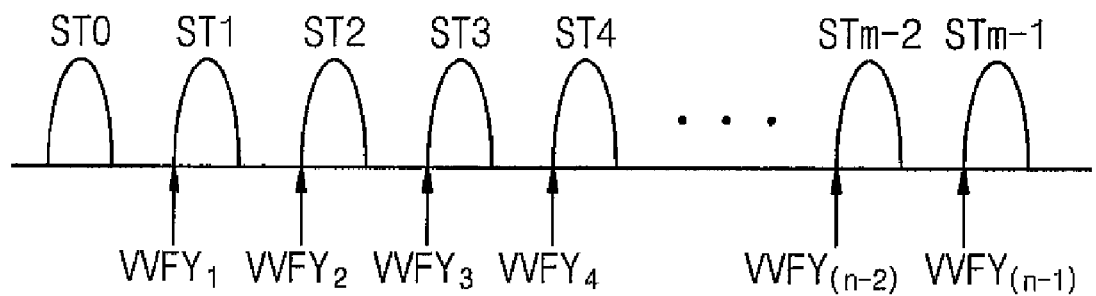
FIG. 6 is a view illustrating a relationship between possible states (or cell states) corresponding to multi-bit data and verify voltages.
Figure 7:
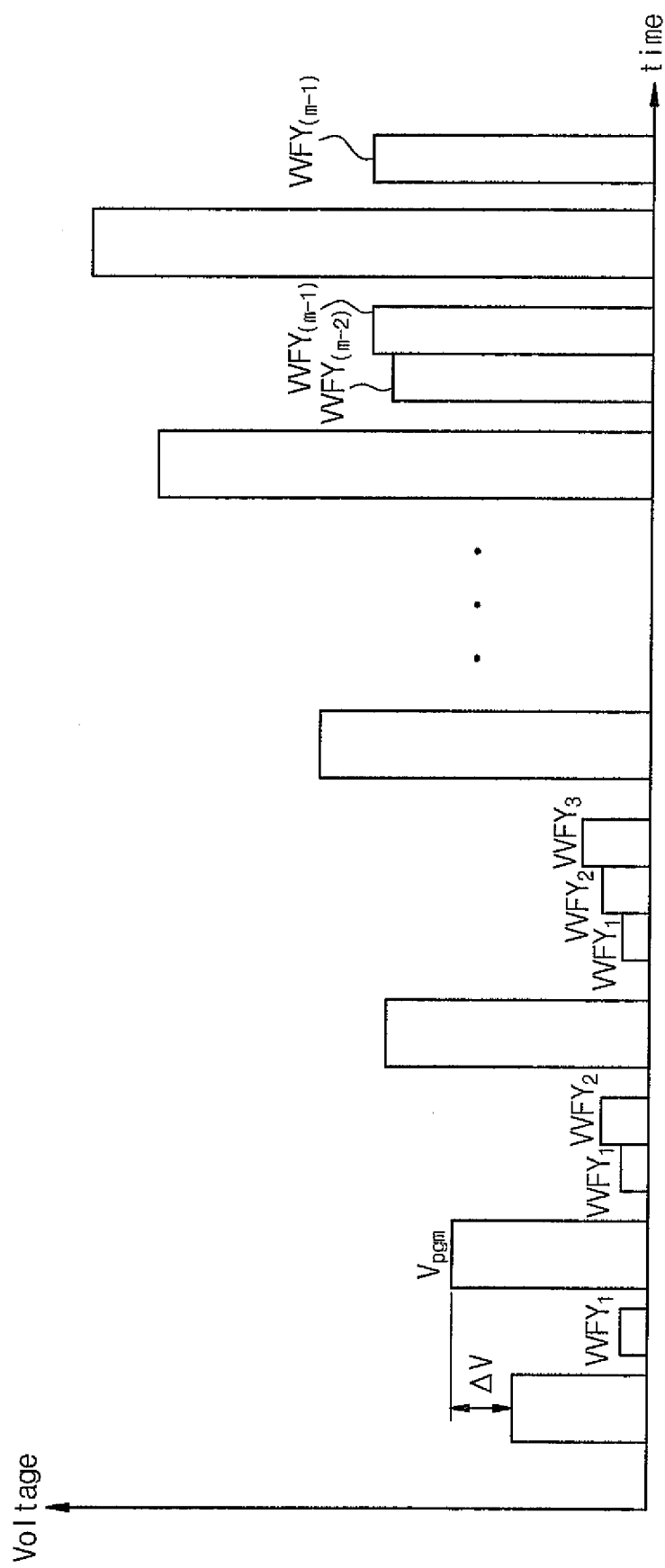
FIG. 7 is a view illustrating a relationship between a program execution period and a program verify period during a program operation of multi-bit data.

FIG. 6 illustrates a relationship between possible states (or cell states) corresponding to multi-bit data and verify voltages. FIG. 7 illustrates a relationship between a program execution period and a program verify period during a program operation of multi-bit data. To store a plurality of data bits on one memory cell, all data bits to be programmed (or, page data bits to be programmed) are loaded into page buffer PB. The loaded data bit corresponds to one shown in FIG. 6. During repetition of a program loop, verify read operations are respectively performed on one verify read operation or at least one state. That is, verify read operations are sequentially performed on states (e.g., ST1 to ST2 or ST1 to ST3) in one program loop. An incremental step pulse programming (ISPP) method is used to accurately control the threshold voltage distribution. According to the ISPP method, a program voltage Vpgm incrementally increases by repeating a program loop. Circuits configured to generate a program voltage according to the ISPP method are disclosed in U.S. Pat. No. 5,642,309, entilted "AUTO-PROGRAM CIRCUIT IN A NONVOLATILE SEMICONDUCTOR MEMORY DEVICE", and in Korean. Pat. No. 2002-39744, entitled "FLASH MEMORY DEVICE CAPABLE OF PREVENTING PROGRAM DISTURB AND METHOD OF PROGRAMMING THE SAME", which are hereby incorporated by reference.

Figure 8:
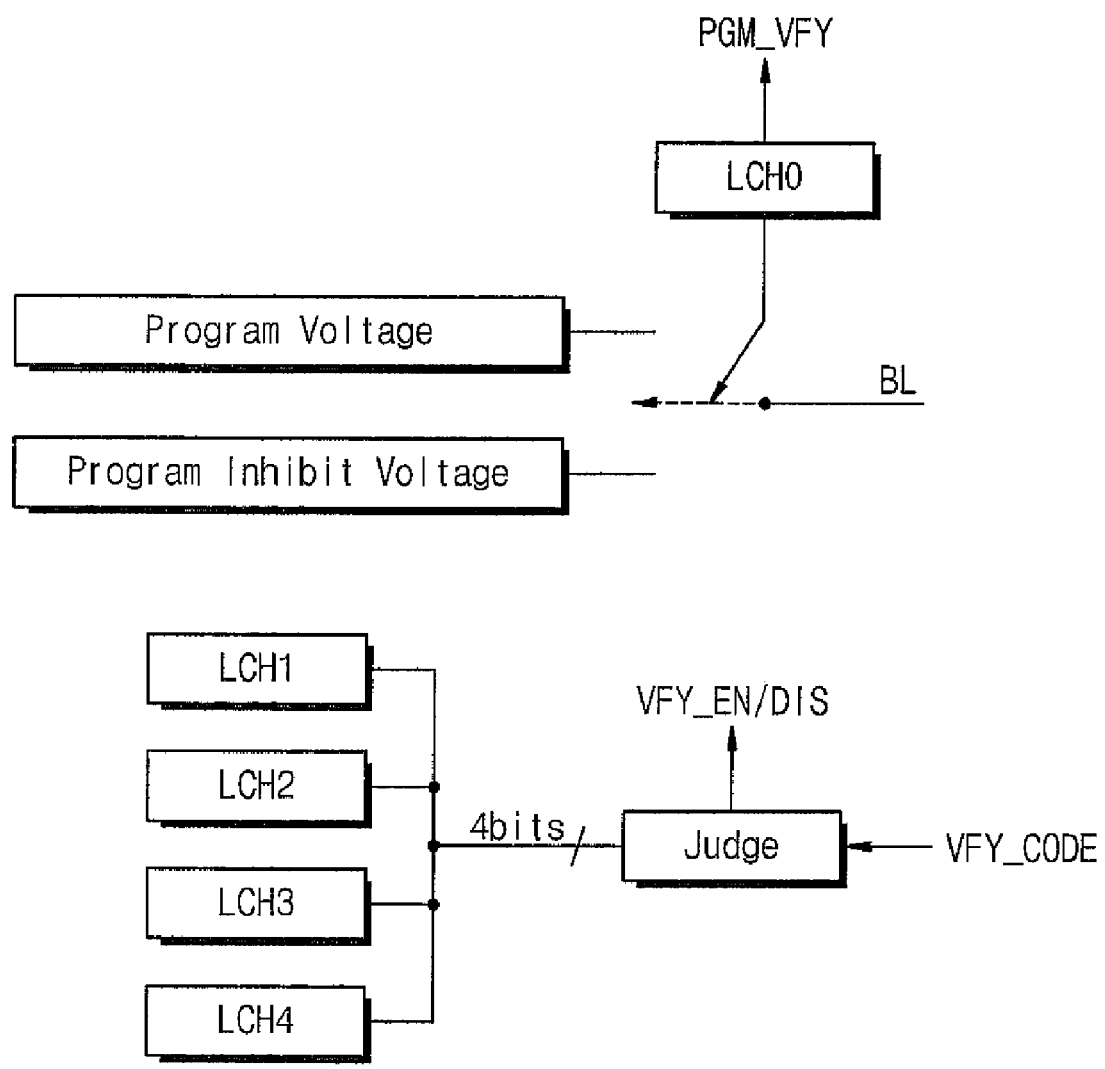
FIG. 8 is a view illustrating a program operation of a flash memory device according to an embodiment of the present invention.

FIG. 8 illustrates a program operation of a flash memory device. By way of example and for convenience of description, an operation for storing 4-bit data on one memory cell will be described. First, the four data bits to be programmed (or, page data bits) are sequentially loaded into program data latch circuits LCH1 to LCH4 of page buffer PB through column select circuit 300. Once the data are loaded (as illustrated in FIG. 5), program confirm latch LCH0 is set with 1 or 0 corresponding to the loaded data. For example, when at least one bit from among the data bits stored in program data latch circuits LCH1 to LCH4 is a program data bit (e.g., 0), the program confirm latch LCH0 is set with a data bit of 0. Alternatively, when all data bits stored in program data latch circuits LCH1 to LCH4 are program prohibit data bit (e.g., 1), program confirm latch LCH0 is set with a data bit of 1.

Next, a program voltage is applied to a word line through row select circuit 400. Bit line BL is driven by a program voltage (e.g., a ground voltage), or a program prohibit voltage (e.g., supply voltage) according to the stored value of the program conform latch LCH0 as illustrated in FIG. 8. This bias condition is maintained for a predetermined time. A verify read operation is performed to determine whether the memory cell is properly programmed or not. It is determined whether a memory cell is programmed with state ST1 during a first program loop. Control logic 600 generates a program verify code representing a first program verify period. Word line voltage generation circuit 500 generates a program verify voltage corresponding to the first program verify period in response to the program verify code VFY_CODE. When the generated program verify voltage VVFY1 is applied to the word line, the verify read operation is performed.

As mentioned above, when the states corresponding to data bits of program data latch circuits LCH1 to LCH4 represent a program verify period of the program verify code, the verify read operation is performed in the page buffer. When the data bits loaded in the program data latch circuits LCH1 to LCH4 correspond to a data state ST4 and the program verify code VFY_CODE represents a first program verify period, the verify read operation is not performed. When values of the program verify VFY codes are not identical to the data bits loaded in program data latch circuits LCH1 to LCH4 as described in FIG. 8, the verify read operation is disabled.

As illustrated in FIG. 7, as the number of program loops increases, the verify read operations performed during a program verify period are respectively performed on a plurality of states. Because a verify read operation corresponding to state ST4 of the data bits loaded in program data latch circuits LCH1 to LCH4 is not performed, a value of program confirm latch LCH0 will be maintained. According to repetition of a program loop, the program verify code VFY_CODE represents a fourth program verify period (corresponding to ST4). Since the data bits loaded into program data latch circuits LCH1 to LCH4 correspond to state ST4 and program verify code VFY_CODE represents a fourth program verify period, the verify read operation will be performed. When values of program verify codes VFY_CODE are identical to the data bits loaded in program data latch circuits LCH1 to LCH4 as illustrated in FIG. 8, the verify read operation is enabled. When a memory cell is determined to be on-cell according to the result of the verify read operation, a value associated with the program confirm latch LCH0 will be maintained and the memory cell is not programmed into the required state ST4. This memory cell is substantially programmed according to the above method in the next program loop. When the memory cell is determined to be off-cell according to the result of the verify read operation, the value associated with the program confirm latch LCH0 changes from state 0 to 1. This means that the memory cell is programmed into the required state ST4 and the memory cell is program-prohibited in the next program loop. Alternatively, when state ST4 corresponds to the highest threshold voltage distribution, the program operation is completed. In this manner, the number of verify read operations in each program loop may be appropriately adjusted. For example, when the program operation is performed according to the ISPP scheme, a threshold voltage change can be approximately predicted. Based on this prediction, verify read operations of each program loop can be determined.

As described above, multi-bit data can be simultaneously programmed into a memory cell without an initial read operation. This program method is called a multi-bit page program scheme. Additionally, because the multi-bit data is simultaneously programmed, the number of program operations can be reduced. However, the number of program operations is not the number of loops. In particular, the number of program operations represents the number of program operations including the LSB and MSB program operations. As compared to the page program scheme, the multi page program scheme of the present invention reduces disturbances as the number of program operations decreases.

Figure 9:
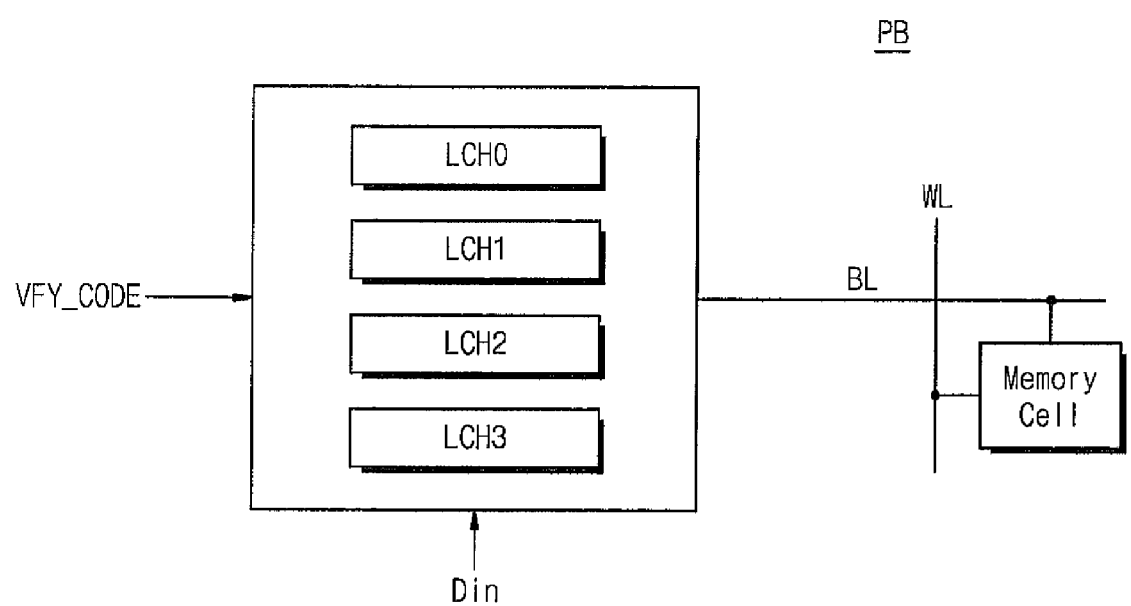
FIG. 9 is a block diagram of a page buffer according to another embodiment of the present invention.

FIG. 9 is a block diagram of a page buffer PB having a plurality of latches. By way of example, when storing 4-bit data on one memory cell, page buffer PB includes four latches LCH0 to LCH3 which constitute a program data latch circuit. Data bits to be programmed according to the above dump scheme are loaded into the program data latch circuit. When at least one bit from among the loaded data bits is 0, a program voltage (e.g., a ground voltage) is supplied to a bit line during a program execution period. When all the loaded data bits are 1, a program prohibit voltage (e.g., a supply voltage) is supplied to the bit line during the program execution period. When the program verify period of the program verify code VFY_CODE represents stages of the data bits loaded into the program data latch circuits, a verify read operation is performed through page buffer PB. When the memory cell is determined as an off-cell based on the verify read operation result, latches LCH0 to LCH3 are set to 1 in order not to perform a program operation and a verify read operation in the next program loop.

Figure 10:
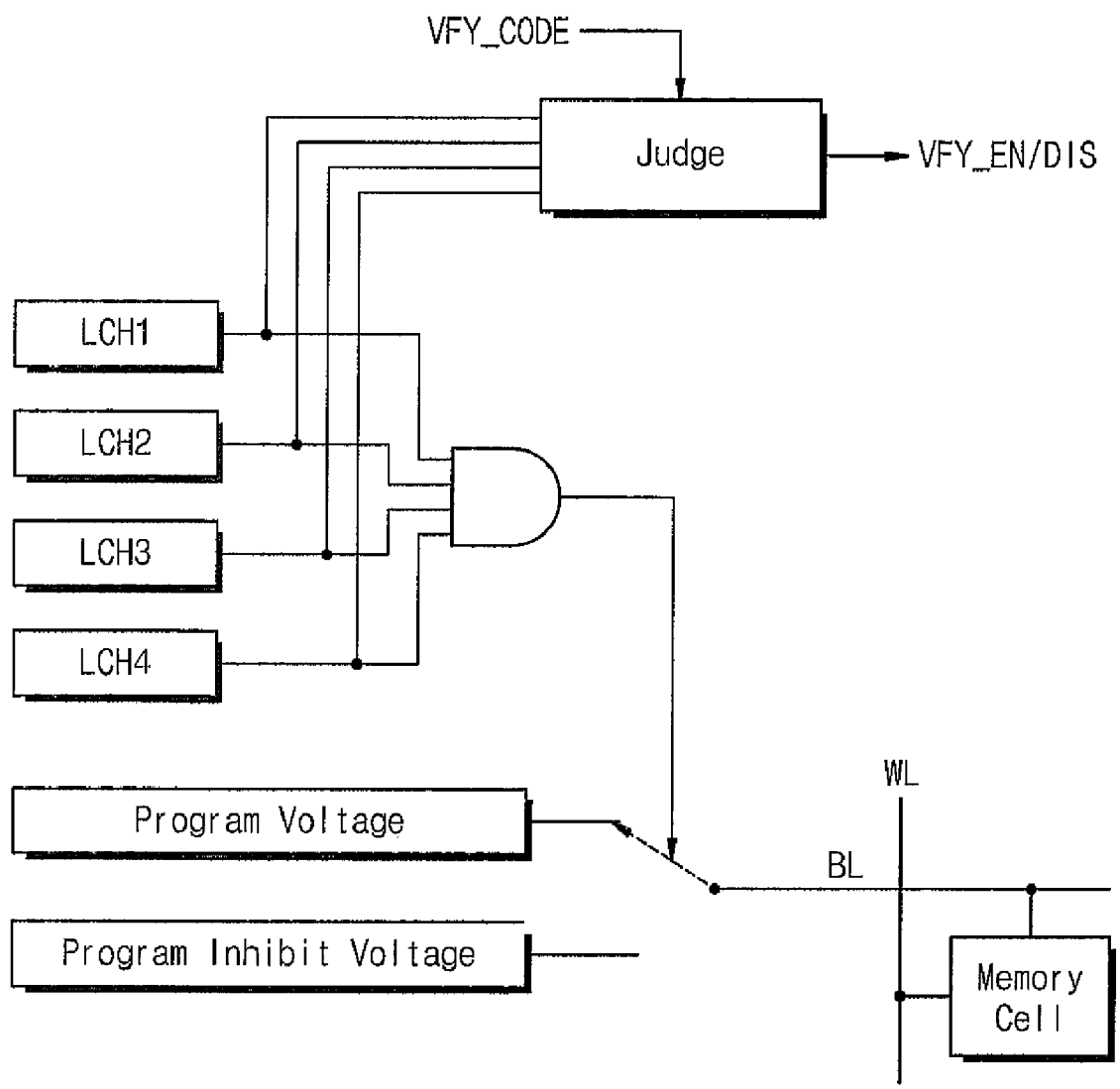
FIG. 10 is a view illustrating a program operation of a flash memory device according to another embodiment of the present invention.

FIG. 10 illustrates a program operation example of a flash memory device for storing 4-bit data on one memory cell. First, the four data bits to be programmed (or, page data bits) are sequentially loaded to program data latch circuits LCH1 to LCH4 of page buffer PB through column select circuit 300. A program voltage is applied to a word line through row select circuit 400. Bit line BL, as illustrated in FIG. 10, is driven by a program voltage (e.g., ground voltage) or a program prohibit voltage (e.g., a supply voltage) based on the data bits loaded into program data latch circuits LCH1 to LCH4. This bias condition is maintained for a predetermined time. A verify read operation is performed to determine whether or not the memory cell is programmed into the required state. In the first program loop, a determination is made as to whether or not the memory cell is programmed into state ST1. Control logic circuit 600 generates a program verify code VFY_CODE indicating a first program verify period and word line voltage generation circuit 500 generates program verify voltage VVFY1 corresponding to the first program verify period in response to program verify code VFY_CODE. The verify read operation is performed when the generated program verify voltage VVFY1 is applied to the word line.

When the states corresponding to data bits of program data latch circuits LCH0 to LCH3 represent a program verify period of the program verify code, the verify read operation is performed in the page buffer. Assuming that the data bits loaded in program data latch circuits LCH0 to LCH3 correspond to a data state ST4 the program verify code VFY_CODE represents a first program verify period and the verify read operation is not performed. That is, values of the program verify code VFY are not identical to the data bits loaded into the program data latch circuits LCH1 to LCH4 (as described in FIG. 10), the verify read operation is disabled. The program loops are repeatedly performed and as the number of program loops increases, the verify read operations performed during a program verify period are respectively performed on a plurality of states as illustrated in FIG. 7.

According to repetition of the program loop, the program verify code VFY_CODE represents a fourth program verify period corresponding to state ST4. Since the data bits loaded into program data latch circuits LCH1 to LCH4 correspond to state ST4 and program verify code VFY_CODE represents a fourth program verify period, the verify read operation will be performed. When the values of the program verify codes VFY_CODE are identical to the data bits loaded into program data latch circuits LCH1 to LCH4 (as illustrated in FIG. 10), the verify read operation is enabled. When a memory cell is determined as an on-cell according to the result of the verify read operation, the values of program confirm latches LCH0 to LCH3 are maintained and the memory cell is not programmed into the required state ST4. In this case, the memory cell is substantially programmed according to the above method in the following program loop. When the memory cell is determined to be off-cell according to the result of the verify read operation, values of the program confirm latches LCH1 to LCH4 change from 0 to 1 which means that the memory cell is programmed into the required state ST4. In this case, the memory cell is program-prohibited in the next program loop. Alternatively, when the state ST4 corresponds to the highest threshold voltage distribution, the program operation is completed. It is apparent to those skilled in the art that a program method of the present invention can be applied to NAND flash memory devices, NOR flash memory devices, PRAMs, MRAMs, etc.

Figure 11:
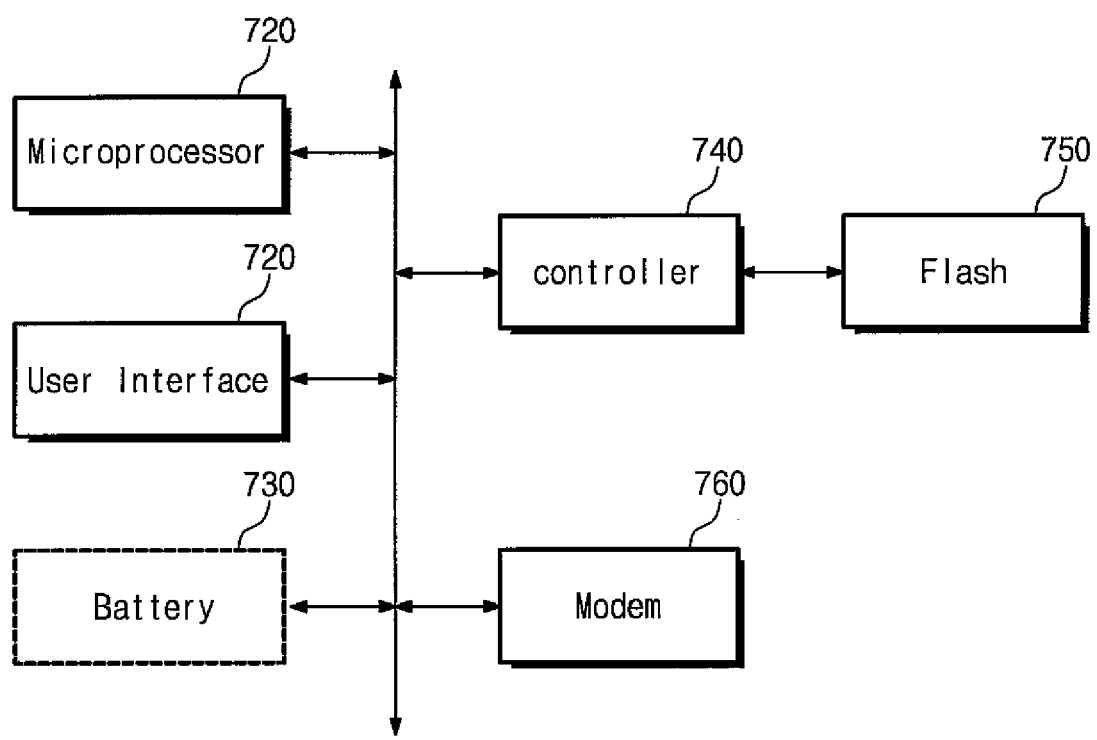
FIG. 11 is a block diagram illustrating a computing system with a flash memory device according to an embodiment of the present invention.

FIG. 11 is a block diagram illustrating a computing system including micro processor 710 that is electrically connected to a bus, user interface 720, modem such as a baseband chipset, memory controller 740, and flash memory device 740. Flash memory device 750 has the same structure as described with reference to FIG. 2. Flash memory device 750 stores N-bit data (where N is an integer equal to or higher than 1) that is processed by micro processor 710 through memory controller 740. When the computing system is configured as a mobile device, battery 750 is utilized to supply an operation voltage for the computing system. Although not illustrated in the drawings, it is apparent to those skilled in the art that the computing system further includes an application chipset, a camera image processor (CIS), a mobile DRAM, etc. As described above, multi-bit data is stored on one memory cell without an initialize read operation. Additionally, since multi-bit data are simultaneously programmed, the number of program operations can be reduced.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A flash memory device comprising:
   a memory cell connected to a word line and a bit line of a memory array; and
   a sense amplifier and write driver circuit communicating with said memory cell array and configured to store data bits to be programmed on the memory cell, said sense amplifier and write driver circuit is further configured to drive the bit line of said memory array through a program voltage during a program execution period when at least one data bit from among the data bits to be programmed is a program data bit, said sense amplifier and write driver circuit also configured to perform a verify read operation when a program verify code representing a verify read period corresponds to a state of the data bits to be programmed.

2. The flash memory device of claim 1, wherein the sense amplifier and write driver circuit is further configured to drive the bit line through a program prohibit voltage during a program execution period regardless of the stored data bits when said verify read operation is passed.

3. The flash memory device of claim 2, wherein the sense amplifier and write driver circuit is configured to drive the bit line through the program prohibit voltage during the program execution period when all the data bits to be programmed correspond to program prohibit data bits.

4. The flash memory device of claim 1, wherein the data bits to be programmed are stored on the sense amplifier and write driver circuit, said data bits to be programmed are set with program prohibit data to drive the bit line through a program prohibit voltage during a program execution period when the verify read operation is passed.

5. The flash memory device of claim 3, wherein the sense amplifier and write driver circuit is configured not to perform the verify read operation when the program verify code representing the verify read period does not correspond to a state of the data bits to be programmed.

6. A flash memory device comprising:
   a memory cell connected to a word line and a bit line of a memory cell array; and
   a sense amplifier and write driver circuit communicating with said memory cell array and configured to store data bits to be programmed on the memory cell, wherein the sense amplifier and write driver circuit includes a program data latch circuit configured to store the data bits to be programmed and a program confirm latch set as a program data bit or a program prohibit data bit according to the data bits to be programmed,
   wherein the sense amplifier and write driver circuit is configured to perform a verify read operation according to whether a program verify code representing a verify read period corresponds to a state of the data bits to be programmed during a program verify period.

7. The flash memory device of claim 6, wherein the sense amplifier and write driver circuit drives the bit line through a program voltage during a program execution period when at least one among the data bits to be programmed in the program data latch circuit is a program data bit.

8. The flash memory device of claim 6, wherein the sense amplifier and write driver circuit is further configured to perform a verify read operation when a program verify code representing a verify read period corresponds to a state of the data bits to be programmed.

9. The flash memory device of claim 6, wherein the sense amplifier and write driver circuit is configured not to perform a verify read operation when a program verify code representing a verify read period does not correspond to a state of the data bits to be programmed.

10. The flash memory device of claim 6, wherein the program confirm latch is set with a program prohibit data bit to drive the bit line through a program prohibit voltage during a program execution period when the verify read operation is passed.

11. The flash memory device of claim 10, further comprising a value stored in the program confirm latch is configured to determine whether or not a program operation is passed.

12. The flash memory device of claim 6, wherein the program data latch circuit comprises a plurality of latches configured to respectively store the data bits to be programmed.

13. The flash memory device of claim 6, wherein the program confirm latch circuit is set with the program prohibit data bit before the data bits to be programmed are inputted.

14. The flash memory device of claim 6, wherein the program confirm latch circuit of the sense amplifier and write driver circuit is set with the program data bit to drive the bit line through a program voltage during a program execution period when at last one bit from among the data bits to be programmed in the program data latch circuit is the program data bit.

15. A flash memory device comprising:
   a memory cell connected to a word line and a bit line of a memory cell array; and a sense amplifier and write driver circuit communicating with said memory cell array and configured to store data bits to be programmed on the memory cell, wherein the sense amplifier and write driver circuit comprises latches for storing the data bits to be programmed, said sense amplifier and write driver circuit configured to drive the bit line through a program voltage during a program execution period when at last one bit from among the data bits to be programmed is a program data bit and performs a verify read operation when a program verify code representing a verify read period corresponds to a state of the data bits to be programmed.

16. The flash memory device of claim 15, wherein the data bits to be programmed that are respectively stored in the latches, are set with program prohibit data to drive the bit line through a program prohibit voltage during the program execution period when the verify read operation is passed.

17. The flash memory device of claim 15, wherein the sense amplifier and write driver circuit is configured not to perform the verify read operation when the program verify code representing the verify read period does not correspond to the state of the data bits to be programmed.

* * * * *